US008961737B2

(12) United States Patent
Nishimura

(10) Patent No.: US 8,961,737 B2
(45) Date of Patent: Feb. 24, 2015

(54) PLASMA PROCESSING APPARATUS

(75) Inventor: Eiichi Nishimura, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 1411 days.

(21) Appl. No.: 12/393,263

(22) Filed: Feb. 26, 2009

(65) Prior Publication Data

US 2009/0229522 A1 Sep. 17, 2009

Related U.S. Application Data

(60) Provisional application No. 61/055,535, filed on May 23, 2008.

(30) Foreign Application Priority Data

Mar. 17, 2008 (JP) ................................. 2008-068097

(51) Int. Cl.
C23C 16/00 (2006.01)
H01L 21/306 (2006.01)
H01J 37/32 (2006.01)

(52) U.S. Cl.
CPC ......... H01J 37/32165 (2013.01); H01J 37/321 (2013.01)
USPC ............ 156/345.48; 118/723 I; 118/723 AN; 118/723 IR

(58) Field of Classification Search
CPC ................ H01J 37/321; H01J 37/3211; H01J 37/32119; H01J 37/32128; H01J 37/32137; H01J 37/32146; H01J 37/32155; H01J 37/32165; H01J 37/32174; H01J 37/32183

USPC ....... 118/723 I, 723 IR, 723 AN; 156/345.48, 156/345.49; 315/111.51
See application file for complete search history.

(56) References Cited

U.S. PATENT DOCUMENTS

| 5,571,366 | A | * | 11/1996 | Ishii et al. ................. 156/345.26 |
| 5,824,607 | A | * | 10/1998 | Trow et al. ..................... 438/732 |
| 5,976,993 | A | * | 11/1999 | Ravi et al. ..................... 438/788 |
| 6,180,019 | B1 | * | 1/2001 | Kazumi et al. .................. 216/78 |
| 6,200,412 | B1 | * | 3/2001 | Kilgore et al. ........... 156/345.28 |
| 6,802,933 | B2 | * | 10/2004 | Khan et al. ............... 156/345.26 |
| 2003/0168427 | A1 | | 9/2003 | Flamm et al. |

FOREIGN PATENT DOCUMENTS

JP 2007-142444 6/2007

* cited by examiner

*Primary Examiner* — Luz Alejandro Mulero
(74) *Attorney, Agent, or Firm* — Oblon, Spivak, McClelland, Maier & Neustadt, L.L.P.

(57) ABSTRACT

A plasma processing apparatus comprises a plasma generation chamber where plasma is generated by exciting a processing gas with high-frequency power applied to a coil wound around a side wall of a reaction container, a processing chamber where a specific type of processing is executed on a wafer with the plasma thus generated and a high-frequency power source capable of selectively outputting either first high-frequency power with a reference frequency or second high-frequency power with a frequency (2n+1)/2 times the reference frequency, to be applied to the coil.

6 Claims, 6 Drawing Sheets

PLASMA PROCESSING APPARATUS

CROSS-REFERENCE TO RELATED APPLICATIONS

This document claims priority to Japanese Patent Application Number 2008-068097, filed on Mar. 17, 2008 and U.S. Provisional Application No. 61/055,535, filed on May 23, 2008, the entire content of which are hereby incorporated by reference.

FIELD OF THE INVENTION

The present invention relates to a plasma processing apparatus that executes a specific type of processing on a processing target substrate by generating plasma from a processing gas.

BACKGROUND OF THE INVENTION

A plasma processing apparatus may be engaged in any of various types of production processing, e.g., etching, ashing and plasma deposition, executed on a processing target substrate such as a semiconductor wafer. As further miniaturization of semiconductor elements adopting multiple layer structures with greater numbers of layers is pursued, the processing will need to be executed with a minimum of collateral damage. For instance, in processing executed by using radicals, the extent of ion damage must be minimized by actively promoting the reaction induced by the radicals. Namely, various measures are taken to prevent damage caused by excess ions, such as undesirable blending of materials constituting different layers at the wafer, destruction of an oxide film, entry of contaminants and alteration in the characteristics of the substrate. In addition, ion impact, likely to lead to low selectivity, should be avoided as much as possible during an etching process executed by defining the selection ratio with a high level of accuracy.

It is known that ion damage to wafers can be effectively prevented by generating plasma with a potential set as low as possible. A device utilized to generate such plasma may include a coil (helical resonance coil) wound around a reaction container that can be depressurized, so as to create a standing wave by causing the coil to resonate in a full wavelength mode with high-frequency power with a predetermined wavelength supplied thereto and generate plasma from a processing gas by forming an induction field within the reaction container (see, for instance, Japanese Laid Open Patent Publication No. 2007-142444). It is assumed that inductively-coupled plasma can be generated at a node at which the phase-voltage switching potential is 0 by canceling out the phase-voltage with the anti-phase voltage.

However, since the potential of plasma generated via a coil resonating in such a full wavelength mode is substantially 0, no sheath is formed between the plasma and the inner wall of the reaction container. This means that only a very low level of self-cleaning performance for cleaning the inner wall of the reaction container through sputtering or the like is achieved. In addition, if a processing gas with a high reaction product vapor pressure and a high reaction product deposition rate is used, reaction products are bound to readily adhere to the inner wall of the reaction container where the plasma is generated. It is to be noted that while this concern may be addressed by adjusting, for instance, the coil electrical length so as to ensure that the phase-voltage and the anti-phase-voltage do not completely cancel each other out, a change in the coil electrical length will require complicated and time-consuming device adjustment.

An object of the present invention, having been achieved by addressing the issues discussed above, is to provide a plasma processing apparatus and a plasma processing method with which plasma and can be generated while minimizing the damage to the processing target substrate and disallowing ready adhesion of reaction products to the inner wall of the reaction container, by simply controlling the high-frequency power supplied to the coil, i.e., by selecting the optimal high-frequency power to be supplied to the coil.

SUMMARY OF THE INVENTION

The object described above is achieved in an aspect of the present invention by providing a plasma processing apparatus that executes a specific type of processing on a processing target substrate with plasma generated by exciting a processing gas, comprising a plasma generation chamber where plasma is generated by exciting the processing gas, a processing chamber in communication with the plasma generation chamber and a stage disposed in the processing chamber, upon which the processing target substrate is placed. The plasma generation chamber includes a reaction container having a tubular side wall constituted with a dielectric material, a processing gas delivery unit via which the processing gas is delivered into the reaction container, a coil wound around the side wall, a high-frequency power source capable of selectively outputting high-frequency power with any of various frequencies to be supplied to the coil and a control unit that selects high-frequency power with a specific frequency to be output from the high-frequency power source and supplied to the coil. With n representing an integer equal to or greater than 1, the coil assumes an electrical length which n times a full wavelength at a reference frequency, and the high-frequency power source is capable of supplying at least high-frequency power with a frequency, which is $(2n+1)/2$ times the reference frequency.

According to the present invention described above, as the processing gas is delivered into the reaction container and high-frequency power is supplied to the coil, plasma is generated from the processing gas inside the reaction container and the specific type of processing can be executed on the processing target substrate in the processing chamber with the plasma thus generated. During this process, simple control under which the high-frequency power supplied to the coil is switched as necessary to the high-frequency power with the frequency $(2n+1)/2$ times the reference frequency is executed according to the present invention, so as to ensure that plasma is generated without allowing reaction products to readily adhere to the inner wall of the reaction container while minimizing damage to the processing target substrate.

Namely, as the high-frequency power with the frequency $(2n+1)/2$ times the reference frequency is supplied to the coil, the coil resonates, including a standing wave. While most of the voltage component of the standing wave is canceled out as the phase voltage and the anti-phase voltage cancel each other out, a voltage component corresponding to half a wavelength at the frequency is not canceled and is sustained. Thus, a potential difference is created between the phase-voltage and the anti-phase voltage and the potential of the plasma does not become exactly 0, thereby inducing capacitive coupling between the inner wall of the reaction container and the plasma, which, in turn, results in the formation of a sheath. Consequently, reaction products are not allowed to readily adhere to the inner wall of the reaction container and any reaction products that have already adhered to the inner wall can be effectively removed. Furthermore, since the voltage component of the standing wave other than that corresponding to the half wavelength of the frequency is canceled out, the plasma potential is not allowed to rise to a level high enough to damage the processing target substrate. In other words, since a plasma potential corresponding to the voltage component that has not been canceled is assumed, the damage to the processing target substrate is minimized.

The high-frequency power source may be capable of selectively outputting either first high-frequency power with the reference high-frequency or second high-frequency power with the frequency $(2n+1)/2$ times the reference frequency. In this case, as the first high-frequency power with the reference frequency is supplied to the coil, the voltage component is canceled out via the phase-voltage and the anti-phase voltage, allowing plasma with a potential of substantially 0 to be generated. In other words, according to the present invention, plasma formed with the first high-frequency power or plasma formed with the second high-frequency power with the frequency $(2n+1)/2$ times the reference frequency can be generated as necessary by switching the high-frequency power applied to the coil.

In addition, the control unit may switch the high-frequency power supplied to the coil in correspondence to the type of processing executed by generating plasma inside the reaction container. The processing executed by generating plasma inside the reaction container may include production processing executed on the processing target substrate and cleaning processing executed to clean the interior of the reaction container. In such a case, the control unit may supply the first high-frequency power to the coil when executing the production processing and supply the second high-frequency power to the coil when executing the cleaning processing. Since the potential of the plasma generated for the production processing is substantially 0, the wafer undergoing the processing is not damaged.

In addition, since the potential of the plasma generated for the cleaning processing is not 0, reaction products having adhered to the side wall of the reaction container during the production processing can be removed efficiently. By switching the high-frequency power supplied to the coil in correspondence to the type of processing executed in the reaction container, as described above, the production processing and cleaning processing, for instance, may be executed in succession.

The control unit may switch the high-frequency power supplied to the coil in correspondence to processing conditions under which the production processing is executed on the processing target substrate. For instance, if the production processing is executed over a plurality of steps, the optimal high-frequency power can be selected for each step.

Such processing conditions may include the type of processing gas used in the processing and, accordingly, the control unit may generate hydrogen plasma by supplying the second high-frequency power with a frequency $(2n+1)/2$ times the reference frequency to the coil if the processing gas is a hydrogen-containing gas. During, for instance, an ashing process executed to remove a resist on the processing target substrate with the hydrogen plasma generated by exciting such a hydrogen-containing gas, reaction products with a relatively high vapor pressure, which will readily adhere to the inner wall of the reaction container, are formed. Accordingly, when such a hydrogen-containing gas is used as the processing gas, the high-frequency power with the frequency $(2n+1)/2$ times the reference frequency may be selected so as to raise hydrogen plasma with the reaction products of which will not readily adhere to the inner wall of the reaction container, while minimizing the extent of damage to the processing target substrate.

According to the present invention, through simple control under which high-frequency power with a specific frequency among a plurality of frequencies is selected, high-frequency power with a frequency $(2n+1)/2$ times the reference frequency can be selected and supplied to the coil. As a result, a plasma processing apparatus capable of raising plasma, the reaction products of which do not readily adhere to the inner wall of the reaction container, while minimizing the extent of damage to the processing target substrate is provided.

DETAILED DESCRIPTION OF THE PREFERRED EMBODIMENTS

Figure 1:
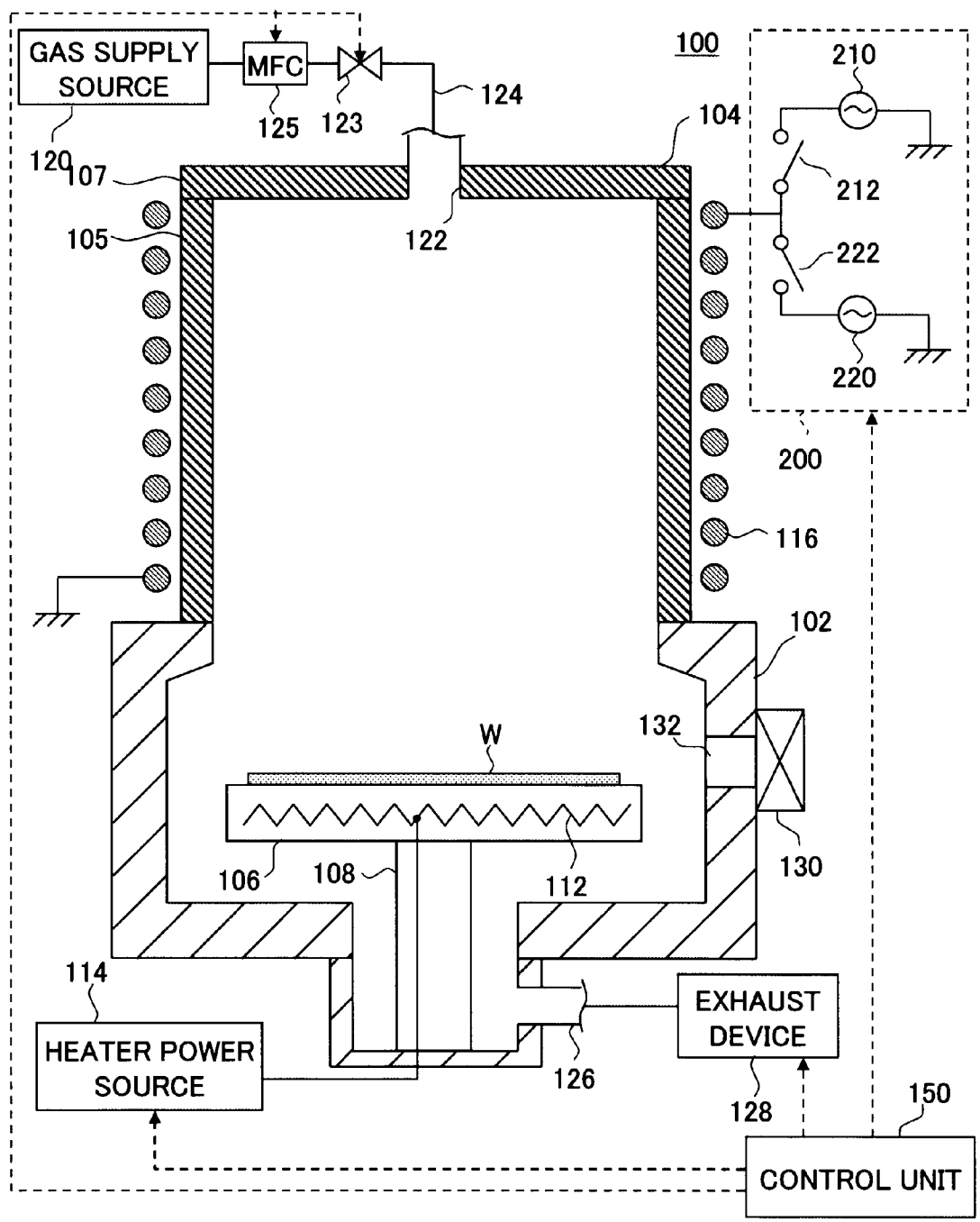
FIG. 1 is a longitudinal sectional view, schematically illustrating the structure adopted in the plasma processing apparatus achieved in an embodiment of the present invention.

The following is a detailed explanation of the preferred embodiment of the present invention, given in reference to the attached drawings. It is to be noted that in the description and the drawings, the same reference numerals are assigned to components having substantially identical functions and structural features to preclude the necessity for a repeated explanation thereof.

(Structural Example for the Plasma Processing Apparatus)

First, in reference to a drawing, a structural example that may be adopted in the plasma processing apparatus achieved in the embodiment of the present invention is explained. The following explanation is provided by assuming that the present invention is adopted in a down-flow type plasma processing apparatus that processes substrates by using radicals generated from plasma generated from a processing gas. FIG. 1 is a longitudinal sectional view schematically illustrating the structure of the plasma processing apparatus 100 achieved in the embodiment.

As shown in FIG. 1, the plasma processing apparatus 100 includes a processing chamber 102 where a wafer W is processed and a plasma generation chamber 104 communicating with the processing chamber 102, where plasma is generated by exciting a processing gas. The plasma generation chamber 104, disposed above the processing chamber 102, is structured so that plasma is generated through an inductively coupled plasma (ICP) method from the processing gas delivered therein.

The edge of the opening formed at the bottom of a reaction container 105 in the plasma generation chamber 104 is set on the edge of the opening formed at the top of the processing chamber 102 and thus, the space within the reaction container 105 and the space within the processing chamber 102 with diameters thereof set substantially equal to each other, are made to communicate with each other. It is to be noted that a partitioning member (not shown) separating the processing chamber 102 and the plasma generation chamber 104 from each other may be detachably installed in the vicinity of the position at which the opening edges are set in alignment with each other. In such a case, a plurality of through holes may be formed at the partitioning member so as to allow active species (e.g., hydrogen radicals) originating from the plasma generated in the plasma generation chamber 104 to travel through the processing chamber.

A disk-shaped stage 106, upon which the wafer W can be supported levelly, is disposed inside the processing chamber 102. The stage 106 is supported by a cylindrical support member 108 disposed at the bottom of the processing chamber 102. The stage 106 is constituted of ceramic such as aluminum nitride.

In addition, a heater 112 that heats the wafer W is installed within the stage 106. As power is supplied to the heater 112 from a heater power source 114, the heater 112 heats the wafer W to a predetermined temperature (e.g., 300° C.). It is desirable that the predetermined temperature be set within a range of, for instance, 250° C.~400° C., over which a low dielectric constant insulating film formed on the wafer W remains substantially undamaged.

An exhaust pipe 126 is connected to the bottom wall of the processing chamber 102 and an exhaust device 128, which includes a vacuum pump, is connected to the exhaust pipe 126. As the exhaust device 128 is engaged in operation, the pressure in the processing chamber 102 and the plasma generation chamber 104 can be lowered to achieve a predetermined pressure.

At the side wall of the processing chamber 102, a transfer port 132 that can be opened/closed via a gate valve 130 is formed. The wafer W is carried into/out of the processing chamber via a transfer mechanism such as a transfer arm (not shown).

The plasma generation chamber 104 is fitted with a substantially cylindrical reaction container 105 constituted of an insulating material such as quartz or ceramic. The top of the reaction container 105 is sealed with a high level of airtightness by a detachable lid 107. A gas delivery port 122 is formed at the lid 107 and a specific type of processing gas originating from a gas supply source 120 is delivered to the space within the plasma generation chamber 104 via the gas delivery port 122. A switching valve 123 via which a gas piping 124 is opened/closed and a mass flow controller 125 that controls the processing gas flow rate, are disposed at the gas piping 124 connecting the gas supply source 120 with the gas delivery port 122.

The processing gas is a hydrogen-containing gas with which hydrogen radicals (H*) can be generated. Such a processing gas may be constituted with hydrogen gas alone or it may be a mixed gas containing hydrogen gas and an inert gas. The inert gas in the mixed gas may be, for instance, helium gas, argon gas or neon gas. It is to be noted that when a mixed gas containing hydrogen gas and an inert gas is used as the processing gas, the hydrogen gas should be mixed with a mixing ratio of, for instance, 4%.

A coil 116 to function as an antenna member is disposed so as to wind around the exterior of the reaction container 105. A high-frequency power source 200 is connected to the coil 116. The high-frequency power source 200 in the embodiment is capable of selectively outputting high-frequency power with a specific frequency selected from a plurality of frequencies. It is to be noted that the structure adopted in the high-frequency power source 200 is to be described in detail later. By supplying high-frequency power at a predetermined power level with a specific frequency from the high-frequency power source 200 to the coil 116, an induction field is formed inside the reaction container 105. Consequently, the processing gas delivered into the plasma generation chamber 104 is excited and plasma is generated.

The plasma processing apparatus 100 structured as described above includes a control unit 150 that controls its various units. Under control executed by the control unit 150 on the individual units based upon specific processing conditions in conformance to a specific program, a specific type of processing such as ashing is executed within the processing chamber.

(Structural Example for the Control Unit)

Figure 2:
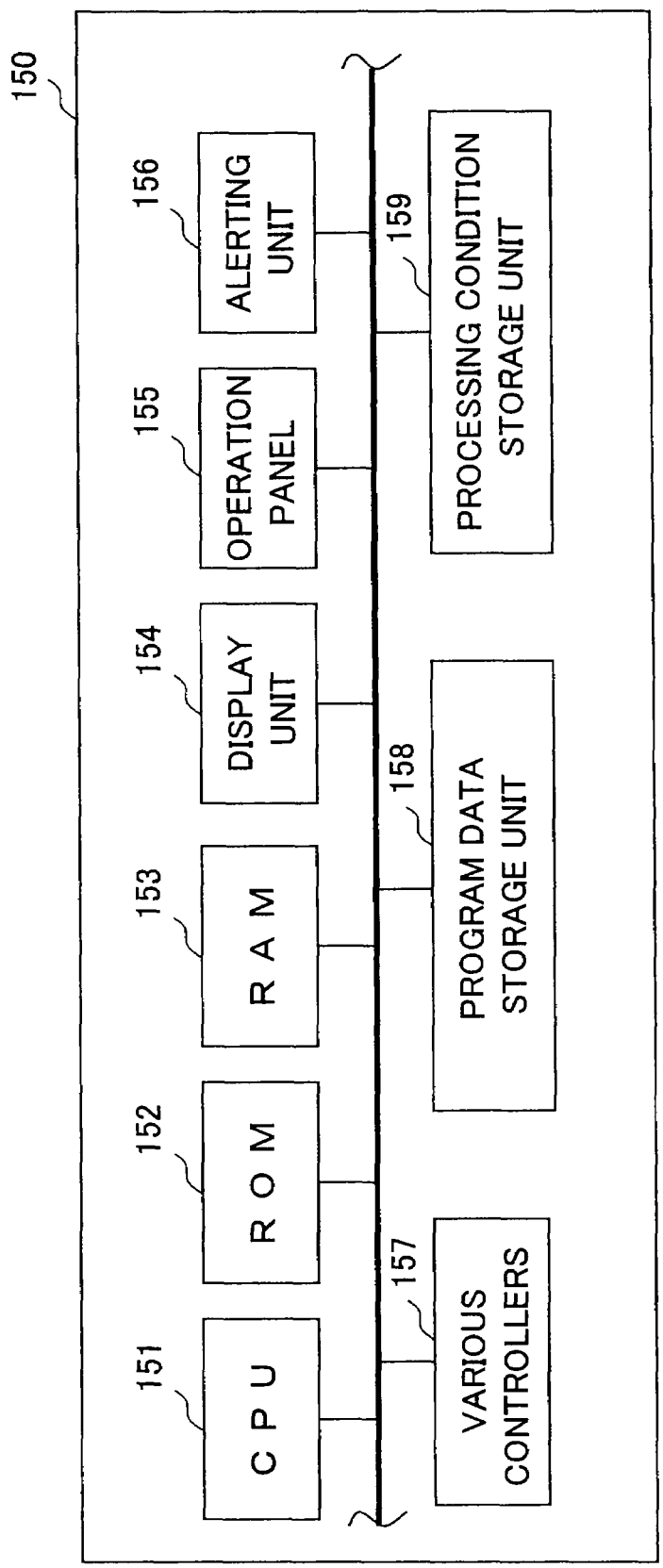
FIG. 2 is a block diagram presenting an example of a structure that may be adopted in the control unit in FIG. 1.

In reference to a drawing, a specific example of a structure that may be adopted in the control unit 150 is described. As shown in FIG. 2, the control unit 150 includes a CPU (central processing unit) 151 constituting the body of the control unit, a ROM (read only memory) 152 where data and the like used by the CPU 151 when controlling the various units are stored, a RAM (random access memory) 153 within which a memory area to be used during various types of data processing executed by the CPU 151 and the like are allocated, a display unit 154 constituted with a liquid crystal display unit or the like, at which operation screens, selection screens and the like are brought up on display, an operation panel 155 via which various types of operations can be performed by the operator or information can be entered by the operator, and an alerting unit 156 constituted with an alarm such as a buzzer.

In addition, the control unit 150 includes various controllers 157 via which the individual units constituting the plasma processing apparatus 100 are controlled. The various controllers 157 include controllers that control the high-frequency power source 200, the mass flow controller 125, the switching valve 123, the exhaust device 128, the heater power source 114 and the like.

The control unit 150 further includes a program data storage unit 158 where program data based upon which processing is executed in the plasma processing apparatus 100 and a processing condition storage unit 159 where information indicating various processing conditions, e.g., recipe data, to be used when executing the processing based upon the program data is stored. The processing conditions in this context may include the processing gas type, the processing gas flow rate, the processing chamber internal pressure and the frequency of the high-frequency power to be output from the high-frequency power source 200, selected from the plurality of frequencies. The data stored in the program data storage unit 158 and the processing condition storage unit 159 constituted with, for instance, a recording medium such as a flash memory, a hard disk or a CD-ROM, are read out by the CPU 151 whenever needed.

The CPU 151, the ROM 152, the RAM 153, the display unit 154, the operation panel 155, the alerting unit 156, the various controllers 157, the program data storage unit 158 and the processing condition storage unit 159 are electrically connected with one another via a bus line such as a control bus, a system bus or a data bus.

Based upon a specific program read out from the program data storage unit 158, the control unit 150 controls the individual units constituting the plasma processing apparatus so as to execute the specific type of processing, such as etching under specific processing conditions, which have been read out from the processing condition storage unit 159.

(High-Frequency Power Source)

Now, high-frequency power with various frequencies, any of which can be selectively output from the high-frequency power source 200 achieved in the embodiment, is described. A specific winding diameter, a specific winding pitch and a specific number of coil turns are set for the coil 116 in the embodiment so that the coil resonates with a frequency that is an integral multiple of a full wavelength of a reference frequency (e.g., 27.12 MHz), so that the coil resonates in a full wavelength mode), in order to form a standing wave with a predetermined wavelength.

Figure 3:
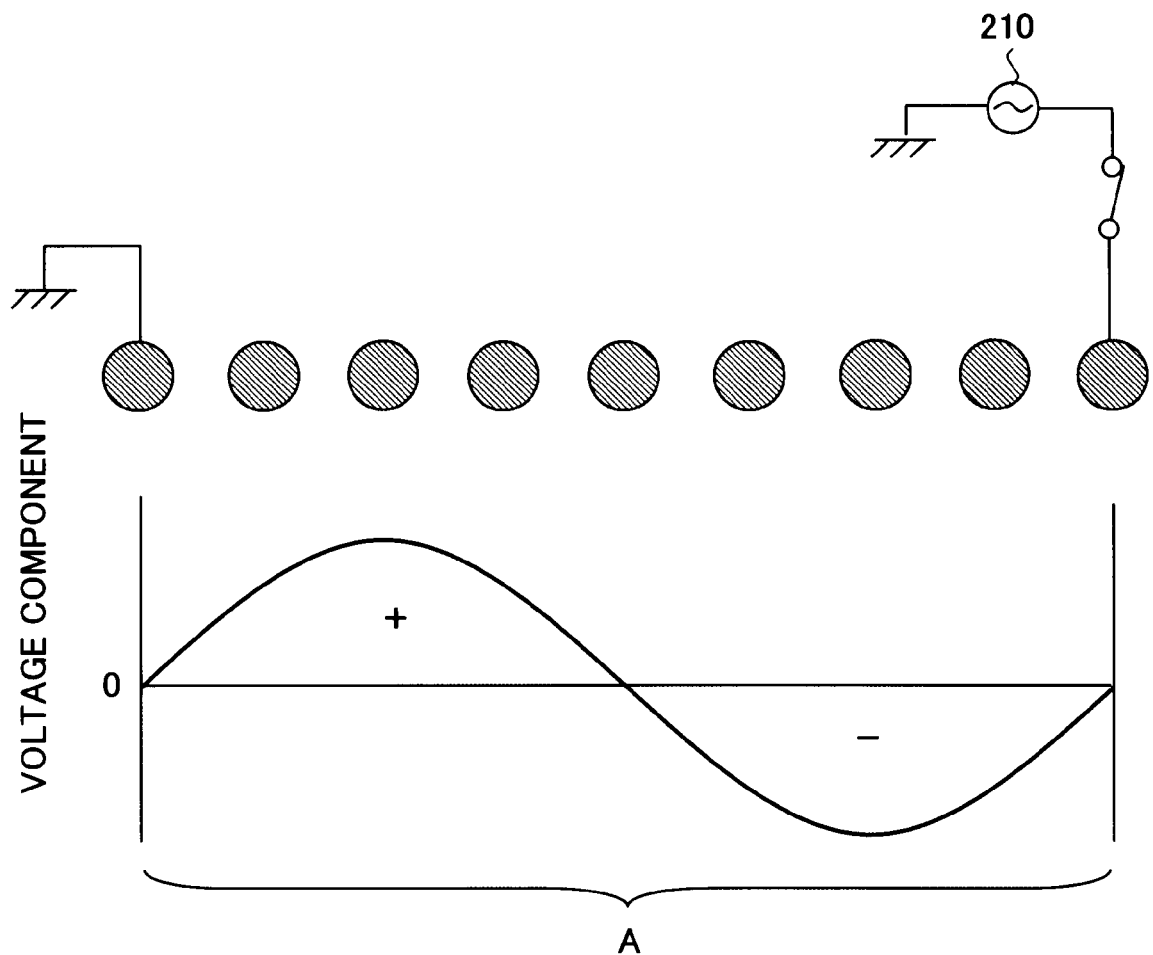
FIG. 3 is a schematic diagram presenting a specific example of the voltage component in the standing wave generated as high-frequency power with the reference frequency is supplied to the coil in the embodiment.

The high-frequency power with the reference frequency, for instance, may be output from the high-frequency source 200. As the coil 116 is caused to resonate in the full wavelength mode with the high-frequency power with the reference frequency applied thereto from the high-frequency power source 200, the capacity momentarily increases/decreases along the opposite direction after each half cycle either in the positive high-frequency power phase or in the negative high-frequency power phase, as indicated in FIG. 3, thereby forming a standing wave with the voltage component canceled by the phase-voltage and the anti-phase voltage, as in the range A in FIG. 3.

As a result, since the current component with a 90° phase offset is at its highest over an area within the reaction container 105, where the voltage component of the coil 116 is 0, induction plasma is generated in the greatest quantity over the area. Hardly any capacitive coupling is induced in this plasma and instead, the plasma is generated in a doughnut-like formation with a very low electrical potential.

Since the voltage component in the plasma is substantially 0, no sheath is formed between the plasma and the inner wall (e.g., the inner side of the side wall) of the reaction container 105. Since only a very low level of self-cleaning performance for cleaning the inner wall of the reaction container 105 through ion strike or the like is achieved, reaction products are bound to adhere readily as a deposit on the inner wall.

However, as the high-frequency power with a frequency (resonance frequency) (2n+1)/2 times the reference frequency with n representing an integer equal to or greater than 1 is supplied to the coil 116, the coil is caused to resonate in a (2n+1)/2 wavelength mode, thereby inducing a standing wave, forming an induction field within the reaction container 105 and generating plasma from the processing gas. Since the coil 116 is caused to resonate in a resonance mode other than the full wavelength mode under these circumstances, part of the voltage component (the part corresponding to the half wavelength) is not canceled, which induces capacitive coupling between the inner wall of the reaction container 105 and the plasma, which, in turn, helps form a sheath, the strength of which corresponds to the voltage component that has not been canceled.

Figure 4:
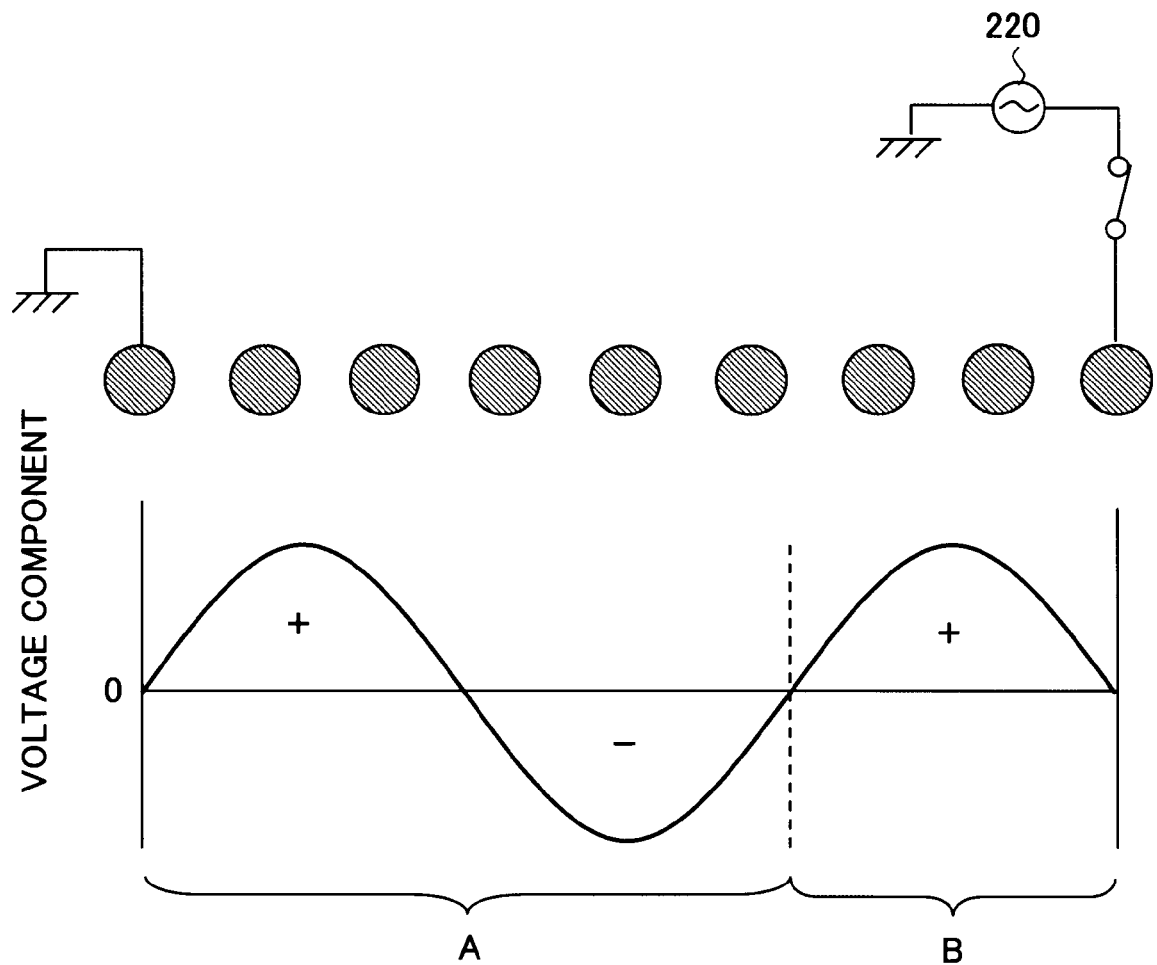
FIG. 4 is a schematic diagram presenting a specific example of the voltage component in the standing wave generated as high-frequency power with a frequency 3/2 times the reference frequency is supplied to the coil in the embodiment.

More specifically, as high-frequency power with a frequency 3/2 times the reference frequency, for instance, is applied to the coil 116, the coil resonates in a 3/2 wavelength mode and induces a standing wave, which results in generation of plasma inside the reaction container 105. At this time, the voltage component of the standing wave over, for instance, the range A in FIG. 4 is canceled by the phase-voltage and the anti-phase voltage, but the voltage component corresponding to a half wavelength of the frequency is not canceled, as over the range B in FIG. 4. Thus, a potential difference is created between the phase-voltage and the anti-phase voltage and the potential of the plasma does not become exactly 0, thereby inducing capacitive coupling between the inner wall of the reaction container 105 and the plasma with a potential corresponding to the voltage component that has not been canceled. The capacitive coupling thus induced, in turn, results in the formation of a sheath.

Figure 5:
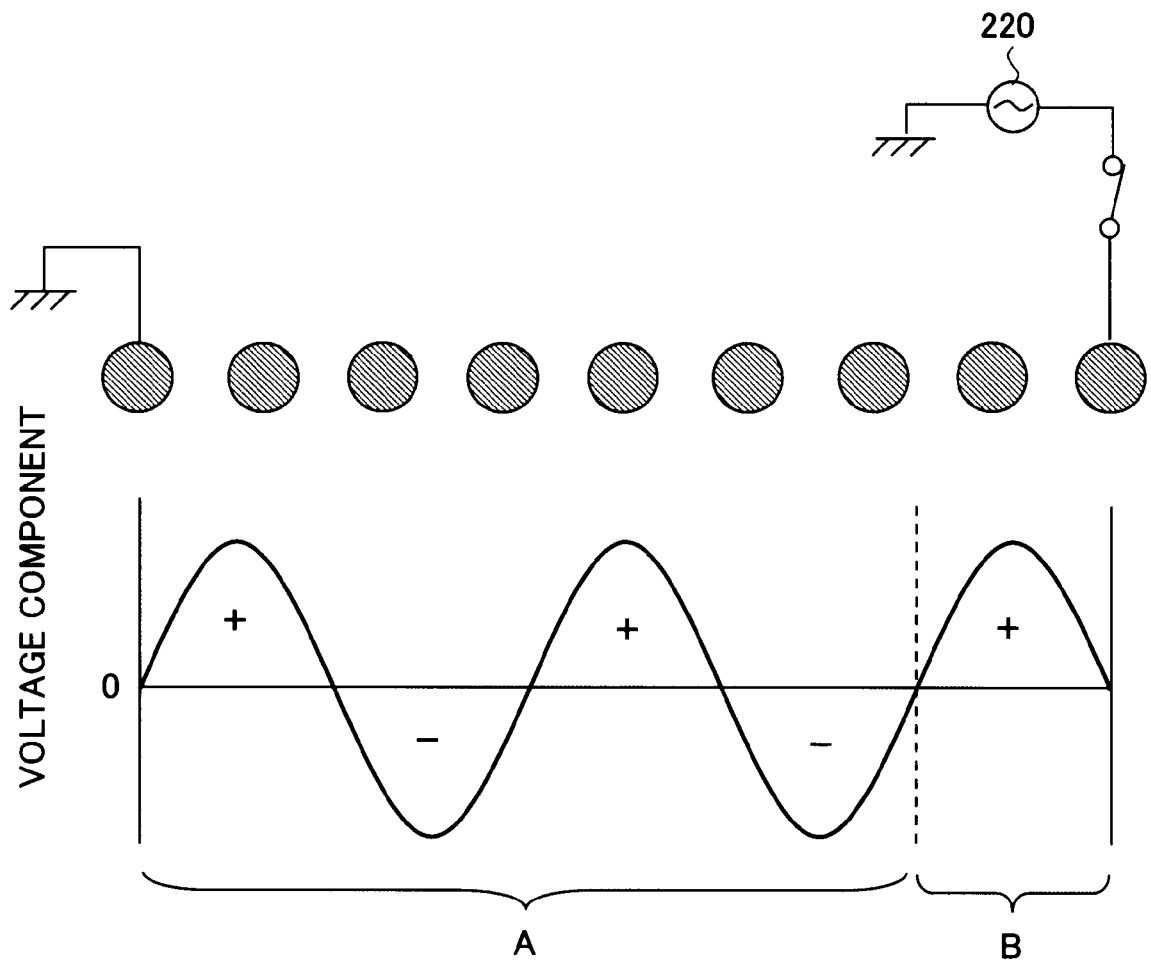
FIG. 5 is a schematic diagram presenting a specific example of the voltage component in the standing wave generated as high-frequency power with a frequency 5/2 times the reference frequency is supplied to the coil in the embodiment.

It is to be noted that when high-frequency power with a frequency 5/2 times the reference frequency is applied to the coil 116, the coil resonates in a 5/2 wavelength mode and induces a standing wave, which results in generation of plasma inside the reaction container 105 through a similar process. At this time, the voltage component of the standing wave over, for instance, the range A in FIG. 5 is canceled by the phase-voltage and the anti-phase voltage, but the voltage component corresponding to a half wavelength of the frequency is not canceled, as over the range B in FIG. 5. Thus, capacitive coupling is induced between the inner wall of the reaction container 105 and the plasma, which results in the formation of a sheath. It is to be noted that since the voltage component corresponding to the half wavelength, which has not been canceled out by the phase-voltage and the anti-phase voltage, as described above, decreases in reverse proportion to n, the plasma potential, too, becomes lower in reverse proportion to n. In other words, plasma with a lower potential can be generated by supplying to the coil 116, high-frequency power with a frequency having n set to a greater value.

By applying high-frequency power with a frequency (2n+1)/2 times the reference frequency (high-frequency power with a wavelength which is (2n+1)/2 times the full wavelength at the reference frequency) to the coil 116 as described above, the coil 116 is caused to resonate to generate plasma inside the reaction container 105 and, at the same time, a sheath is formed between the plasma and the inner wall of the reaction container 105. As a result, reaction products having become adhered to the side wall of the reaction container 105 can be removed efficiently and further adhesion of reaction products is prevented. Furthermore, since the voltage component of the standing wave, other than that corresponding to the half wavelength of the frequency, is canceled out and the plasma potential corresponding to the voltage component that has not been canceled is assumed, the potential of the plasma does not increase to an undesirably high level to damage the wafer W or the inner wall of the reaction container 105.

Accordingly, assuming that the frequency at which the coil 116 is caused to resonate in the full wavelength mode is designated as the reference frequency, the high-frequency source 200 achieved in the embodiment, adopts a structure that enables it to selectively output high-frequency power (high-frequency power used to cause the coil 116 to resonate) with a specific frequency among a plurality of frequencies including the reference frequency and a frequency (2n+1)/2 times the reference frequency and thus, the high-frequency power with the frequency selected through high-frequency power switching is supplied to the coil 116. Through processing executed by switching with predetermined timing to the high-frequency power with the frequency (2n+1)/2 times the reference frequency, reaction products having become adhered to the side wall of the reaction container 105 can be removed efficiently.

(Structural Example for the High-Frequency Power Source)

A specific example of a structure that may be adopted in the high-frequency power source 200 is now described. The high-frequency power source may include a first high-frequency power source 210 that outputs first high-frequency power with the reference frequency at a predetermined power level, a second high-frequency power source 220 that outputs second high-frequency power with a frequency $(2n+1)/2$ times the reference frequency at a predetermined power level, a selector switch 212 via which the first high-frequency power source 210 is connected to the coil 116 and a selector switch 222 via which the second high-frequency power source 220 is connected to the coil 116, as shown in FIG. 1. The selector switches 212 and 222 are controlled by the control unit 150. It is to be noted that the high-frequency power source 200 may adopt a structure other than that described above. For instance, the high-frequency power source may include a selector that operates in response to a control signal provided from the control unit 150 instead of the selector switches, and the first high-frequency power output or the second high-frequency power output may be selected via the selector. In addition, while the high-frequency power source 200 is constituted with a plurality of high-frequency power sources in this example, the present invention is not limited to this structure and, instead, the high-frequency power source may be constituted with a single high-frequency power source capable of generating high-frequency power with a plurality of frequencies and selectively outputting high-frequency power with a specific frequency selected from the plurality of frequencies.

The frequency of the first high-frequency power, i.e., the reference frequency, may be set to, for instance, 27.12 MHz and in correspondence, the frequency of the second high-frequency power may be set to 40.68 MHz, which is 3/2 times the reference frequency. The coil 116 should assume an electrical length that allows the coil to resonate with a frequency that is an integral multiple of the reference frequency, i.e., an integral multiple of the full wavelength at the reference frequency, i.e., 27.12 MHz.

At the plasma processing apparatus 100 equipped with the high-frequency power source 200 structured as described above, plasma with its potential at 0 can be generated inside the reaction container 105 as the coil 116 is caused to resonate with the first high-frequency power supplied thereto, whereas plasma with a low potential can be raised inside the reaction container 105 as the coil 116 is caused to resonate with the second high-frequency power supplied thereto. In the embodiment, while high-frequency power is being supplied to the coil 116, the frequency of the high-frequency power can be switched in correspondence to the processing conditions under which the wafer W is processed. As an alternative, the high-frequency power supplied to the coil 116 may be switched in correspondence to the type of processing that the wafer W is to undergo. For instance, the wafer W may be processed with plasma with its potential at 0, generated with the first high-frequency power, so as to ensure that the damage to the wafer is minimized, and then plasma with a low potential may be generated with the second high-frequency power for a cleaning process to be executed to clean the interior of the reaction container 105, so as to effectively remove reaction products having become adhered to the inner wall of the reaction container 105.

Figure 6:
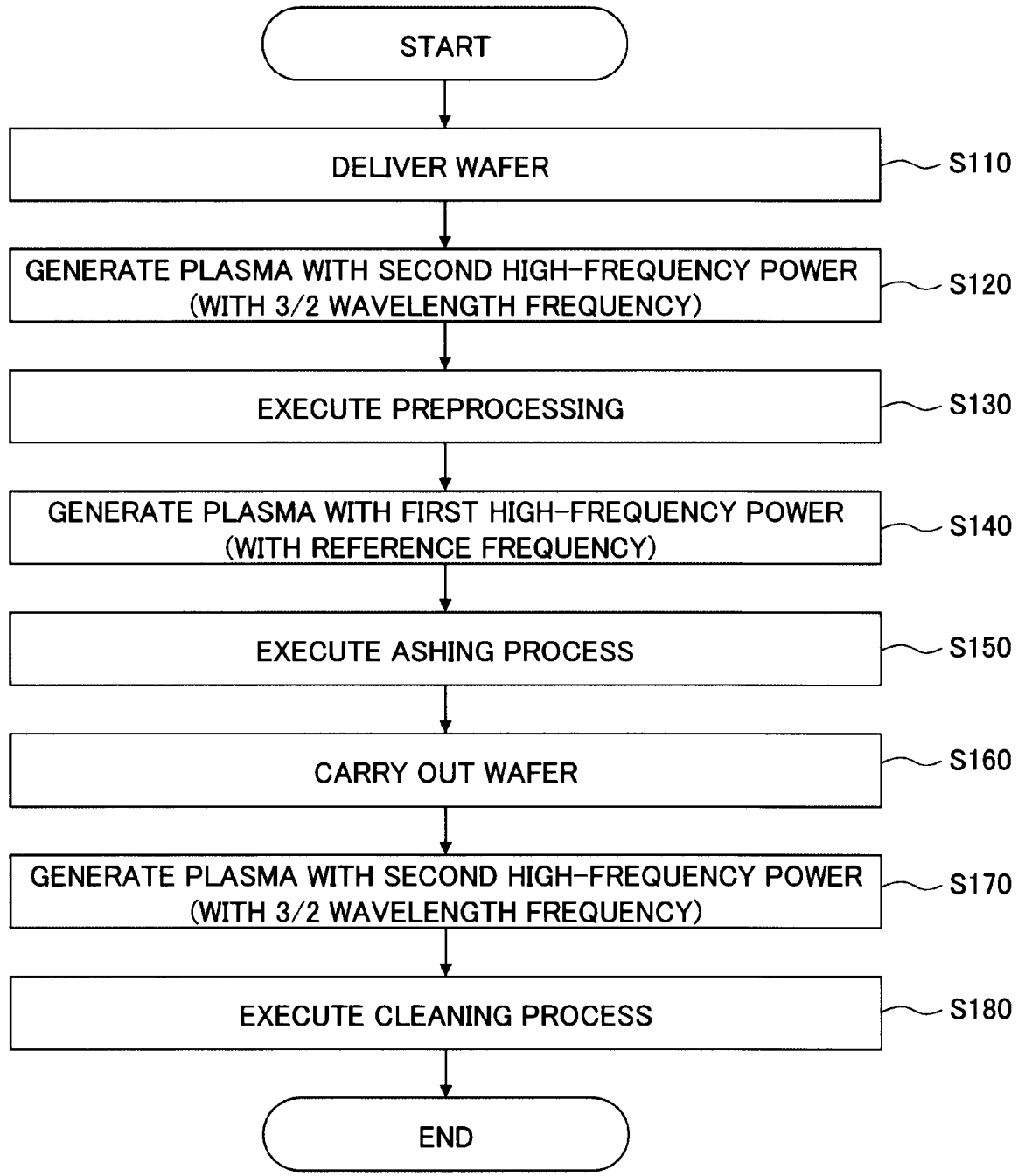
FIG. 6 presents a flowchart of a specific example of wafer processing that may be executed in the plasma processing apparatus achieved in the embodiment.

Next, in reference to a drawing, a specific example of wafer processing that may be executed in the plasma processing apparatus 100 equipped with the high-frequency power source 200 described above is explained. FIG. 6 presents a flowchart of a specific example of the wafer processing. FIG. 6 presents a specific example of an ashing process that may be executed to remove a resist film at a wafer W having undergone the selective etching process through which a low dielectric constant insulating film such as a low-k film has been selectively etched off by using the resist as a mask.

The wafer W is processed as the control unit 150 controls the individual units as shown in the flowchart presented in FIG. 6. In this example, following preprocessing executed to remove matter having become adhered to the wafer W, such as a residue, during the etching process, the ashing process is executed in succession and then a cleaning process is executed to remove reaction products and the like adhering to the inner wall of the reaction container 105.

In step S110, the control unit 150 executes control so as to carry the wafer W having undergone the etching process into the processing chamber 102. More specifically, the wafer W is carried on a transfer arm or the like (not shown) into the processing chamber 102 via the gate valve 130 and the wafer W is then placed onto the stage 106. It is to be noted that the following processing is executed by maintaining the temperature setting for the heater 112 at, for instance, 300° C.

Next, in step S120, the second high-frequency power is supplied to the coil 116, thereby generating plasma. Then, in step S130, the preprocessing is executed to remove matter having become adhered to the wafer W. More specifically, a processing gas (e.g., a processing gas constituted with hydrogen gas and helium gas) is supplied from the gas supply source 120 into the reaction container 105 where the internal pressure has been reduced to a predetermined level and the second high-frequency power with a frequency 3/2 times the reference frequency is supplied to the coil 116 by turning on the selector switch 222 at the high-frequency power source 200 while sustaining the selector switch 212 in the OFF state.

As a result, an induction field is formed inside the reaction container 105 and plasma is generated. The voltage component of the plasma thus generated includes a voltage component such as that shown in FIG. 4, which is not canceled out by the phase-voltage and the anti-phase voltage. Consequently, the plasma potential corresponding to the residual voltage component is assumed, which allows ions in the plasma to travel to the space directly above the wafer W and thus makes it possible to remove matter having adhered onto the wafer (e.g., residue remaining after the etching process) with the ions. It is to be noted that since most of the voltage component in the plasma generated in the step described above is canceled out by the phase-voltage and the anti-phase voltage, as shown in FIG. 4, the plasma potential does not rise to any significant degree, and thus, the wafer W is not damaged by the ions.

In addition, the sheath formed between the plasma and the inner wall of the reaction container 105 allows some of the ions in the plasma to travel to the inner wall of the reaction container 105. As a result, reaction products having become adhered to the side wall of the reaction container 105 can be removed with the ions. Furthermore, no more reaction products are allowed to adhere to the side wall. Once the preprocessing ends, the second high-frequency power supply is stopped by turning off the selector switch 222 at the high-frequency power source 200.

Next, in step S140, the first high-frequency power is supplied to the coil 116 and plasma is thus generated. In step S150, the ashing process is executed to remove the resist film on the wafer W. More specifically, a processing gas (e.g., a processing gas constituted with hydrogen gas and helium gas) is supplied into the reaction container 105 where the internal pressure has been reduced to a predetermined level and the first high-frequency with the reference frequency is supplied to the coil 116 by turning on the selector switch 212 at the high-frequency power source 200 while sustaining the selector switch 222 in the OFF state.

As a result, an induction field is formed inside the reaction container 105 and plasma assuming a potential of substantially 0 is generated. Thus, the ashing process progresses with radicals alone reaching the space directly above the wafer W, since ions in the plasma are not allowed to travel to the wafer W. Consequently, the ashing process is executed without damaging the surface of the wafer W. Once the ashing process ends, the first high-frequency power supply is stopped by turning off the selector switch 212 at the high-frequency power source 200. In the following step S160, the wafer W is transferred. In more specific terms, the wafer W is carried out of the processing chamber 102 on a transfer arm or the like (not shown) via the gate valve 130.

In step S170, the second high-frequency power is supplied to the coil 116 to generate plasma, and then the cleaning process is executed to clean the interior of the reaction container 105 in step S180, before the processing sequence ends. In more specific terms, a processing gas (e.g., a processing gas constituted with hydrogen gas and helium gas) is supplied from the gas supply source 120 into the reaction container 105 where the internal pressure has been reduced to a predetermined level and the second high-frequency power with a frequency 3/2 times the reference frequency is supplied to the coil 116 by turning on the selector switch 222 at the high-frequency power source 200.

As a result, an induction field is formed inside the reaction container 105 and plasma is generated. The voltage component of the plasma thus generated includes a voltage component such as that shown in FIG. 4, which is not canceled out by the phase-voltage and the anti-phase voltage. Consequently, the plasma assumes a potential other than 0 and a sheath is formed between the plasma and the inner wall of the reaction container 105. Ions in the plasma are thus allowed to travel to the inner wall of the reaction container 105. As a result, reaction products having become adhered to the side wall of the reaction container 105 can be removed with the ions. Furthermore no more reaction products are allowed to adhere to the side wall. It is to be noted that since most of the voltage component in the plasma generated in the step described above is canceled out by the phase-voltage and the anti-phase voltage, the plasma potential does not rise to any significant degree, and thus, the side wall of the reaction container 105 is not damaged by the ions.

It is to be noted that while a hydrogen-containing gas is used as the processing gas in the ashing process in the embodiment described above, the present invention is not limited to this example and a processing gas containing oxygen may be used instead, depending upon the type of film to be removed through ashing. While oxygen radicals generated by raising an oxygen-containing gas to plasma are used in an ashing process in the related art, a low dielectric constant insulating films such as a low-k film tends to be readily damaged by oxygen radicals and, for this reason, it is more desirable to etch or ash a low dielectric constant insulating film by using hydrogen radicals with which the extent of damage can be more effectively controlled.

However, hydrogen plasma generated by exciting a hydrogen-containing gas may produce reaction products (e.g., polymers) with relatively high vapor pressures during the etching process or the ashing process, depending upon the type of processing target film and such reaction products may readily adhere to the inner wall of the reaction container. Oxygen plasma generated by exciting an oxygen-containing gas, on the other hand, produces reaction products (e.g., $CO_2$, CO) with relatively low vapor pressures during the etching process or the ashing process and these reaction products do not readily adhere to the inner wall of the reaction container.

Accordingly, when executing step S140 described earlier by using a hydrogen-containing gas as the processing gas, the second high-frequency power with the frequency (2n+1)/2 times the reference frequency may be supplied to the coil 116 so as to generate hydrogen plasma with a low potential instead of plasma with a potential of 0. In this case, the ashing process can be executed by ensuring that reaction products do not readily adhere to the inner wall of the reaction container 105 while minimizing the damage to the wafer W.

If, on the other hand, step S140 is executed by using an oxygen-containing gas as the processing gas, reaction products will not readily adhere to the side wall of the reaction container 105 and thus, the first high-frequency power with the reference frequency may be supplied to the coil 116 so as to generate oxygen plasma with a potential of substantially 0. In this case, the ashing process can be executed by more effectively preventing damage to the wafer.

It is to be noted that the present invention, having been described in detail in reference to the embodiment, may be adopted in a system constituted with a plurality of devices or in an apparatus constituted with a single device. It is obvious that the present invention may be achieved by providing a system or an apparatus with a medium such as a storage medium having stored therein a software program for realizing the functions of the embodiment described above and enabling a computer (a CPU or an MPU) in the system or the apparatus to read out and execute the program stored in the medium such as a storage medium.

The functions of the embodiment described above are achieved in the program itself, read out from the medium such as a storage medium, whereas the present invention is embodied in the medium such as a storage medium having the program stored therein. The medium such as a storage medium in which the program is provided may be, for instance, a floppy disk, a hard disk, an optical disk, a magneto-optical disk, a CD-ROM, a CD-R, a CD-RW, a DVD-ROM, a DVD-RAM, a DVD-RW, a DVD+RW, magnetic tape, a nonvolatile memory card or a ROM. In addition, the program may be downloaded to a storage medium via a network.

It is to be noted that the scope of the present invention includes an application in which an OS or the like operating on a computer executes the actual processing in part or in whole in response to the instructions in the program read out by the computer and the functions of the embodiment are achieved through the processing thus executed, as well as an application in which the functions of the embodiment are achieved as the computer executes the program it has read out.

The scope of the present invention further includes an application in which the program read out from the medium such as a storage medium is first written into a memory in a function expansion board loaded in a computer or a function expansion unit connected to the computer, a CPU or the like in the function expansion board or the function expansion unit executes the actual processing in part or in whole in response to the instructions in the program and the functions of the embodiment described above are achieved through the processing.

While the invention has been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention.

For instance, the present invention may be adopted in any of various types of plasma processing apparatuses that execute plasma processing other than an ashing process, such as an etching process and a film forming process, on a processing target substrate. In addition, the present invention may be adopted in a remote plasma-type plasma generation chamber where plasma is generated in a space away from the wafer, instead of the downflow type plasma generation chamber described earlier.

What is claimed is:

1. A plasma processing apparatus that executes a predetermined type of processing on a substrate with plasma generated by exciting a processing gas, comprising:
 a plasma generation chamber where plasma is generated by exciting the processing gas;
 a processing chamber in communication with said plasma generation chamber; and
 a stage disposed in said processing chamber, upon which the substrate is placed, wherein
 said plasma generation chamber includes:
  a reaction container having a tubular side wall constituted with a dielectric material;
  a processing gas delivery unit via which the processing gas is delivered into said reaction container;
  a coil wound around said side wall;
  a high-frequency power source configured to output high-frequency power to the coil so that the coil resonates with standing waves, said high-frequency power source including,
  a first high-frequency power source that outputs a first high-frequency power with a reference frequency, and
 a second high-frequency power source that outputs a second high-frequency power with a frequency $(2n+1)/2$ times the reference frequency with n representing an integer equal to or greater than 1;
  said coil has an electrical length n times a full wavelength at the reference frequency;
  a control unit programmed to control a selector device which selectively outputs one of the first high-frequency power and the second high-frequency power only to a side of the coil opposite a ground of the coil;
  said control unit programmed to supply by control of the selector device the first high-frequency power to the coil to produce a first standing wave at the reference frequency such that, when the first high-frequency power is supplied to the coil, no sheath is formed between the plasma generated in the plasma generation chamber and the side wall of the reaction container, and
  said control unit programmed to supply by control of the selector device the second high-frequency power to the coil to produce a second standing wave at said frequency $(2n+1)/2$ times the reference frequency such that, when the second high-frequency power is supplied to the coil, a sheath is formed between the plasma generated in the plasma generation chamber and the side wall of the reaction container.

2. The plasma processing apparatus according to claim 1, wherein
 the control unit includes a storage unit that stores a type of processing to be executed by generating plasma inside the reaction container, and
 said control unit is programmed to switch between the first high-frequency power and the second high-frequency power according to the type of processing stored in the storage unit.

3. The plasma processing apparatus according to claim 2, wherein
 the type of processing includes production processing executed on the substrate and cleaning processing executed to clean an interior of said reaction container; and
 said control unit supplies the first high-frequency power to said coil when executing the production processing and supplies the second high-frequency power to said coil when executing the cleaning processing.

4. The plasma processing apparatus according to claim 3, wherein
 the storage unit stores a processing condition defining processing to be executed on the substrate, and
 said control unit switches between the first high-frequency power and the second high-frequency power according to the processing condition stored in the storage unit.

5. The plasma processing apparatus according to claim 4, wherein
 said processing condition indicates a type of processing gas; and
 said control unit generates hydrogen plasma from said processing gas constituted with a hydrogen-containing gas by supplying the second high-frequency power to said coil.

6. The plasma processing apparatus according to claim 1, wherein
 when the first high-frequency power is supplied to the coil, the coil resonates and induces a first standing wave where phase voltage and anti-phase voltage canceled each other, and
 when the second high-frequency power is supplied to the coil, the coil resonates and induces a second standing wave where a component corresponding to apart of a wavelength at the second frequency is not canceled.

* * * * *